United States Patent [19]

Anderson et al.

[11] 4,352,274
[45] Oct. 5, 1982

[54] CIRCUIT BOARD MOUNTING AND COOLING ASSEMBLY

[75] Inventors: Jared A. Anderson, Woodside; Robert V. Van Gelder, Berkeley; Lauren F. Yazolino, Oakland; Jimmy E. Braun, Orange, all of Calif.

[73] Assignee: Signetics Corporation, Sunnyvale, Calif.

[21] Appl. No.: 155,695

[22] Filed: Jun. 2, 1980

Related U.S. Application Data

[62] Division of Ser. No. 894,925, Apr. 10, 1978.

[51] Int. Cl.³ .......................... F25B 1/00; F25D 17/04
[52] U.S. Cl. ........................................ 62/229; 62/418; 361/384
[58] Field of Search .................. 62/418, 229; 361/381, 361/383, 384, 310

[56] References Cited

U.S. PATENT DOCUMENTS

| | | | |
|---|---|---|---|
| 2,187,011 | 1/1940 | Braden | 361/384 X |
| 3,396,780 | 8/1968 | Koltuniak et al. | 361/384 X |
| 3,723,823 | 3/1973 | Lit et al. | 361/415 |
| 3,925,710 | 12/1975 | Ebert | 361/383 |
| 4,277,815 | 7/1981 | Scroupa | 361/383 |

Primary Examiner—William E. Wayner
Attorney, Agent, or Firm—Allegretti, Newitt, Witcoff & McAndrews, Ltd.

[57] ABSTRACT

A cabinet for a central processing unit, made up of a card cage and refrigeration unit, for mounting and cooling electronic components on a group of vertically-aligned, closely-spaced circuit boards. A source of recirculating, forced, refrigerated air is employed to remove the heat from the highly concentrated electronic components. For ease of maintenance, the refrigeration unit and the power supply unit take the form of independently removable modules, and the removable circuit boards are mounted in a readily accessable card cage which incorporates formed card guides which facilitate card removal and insertion.

6 Claims, 14 Drawing Figures

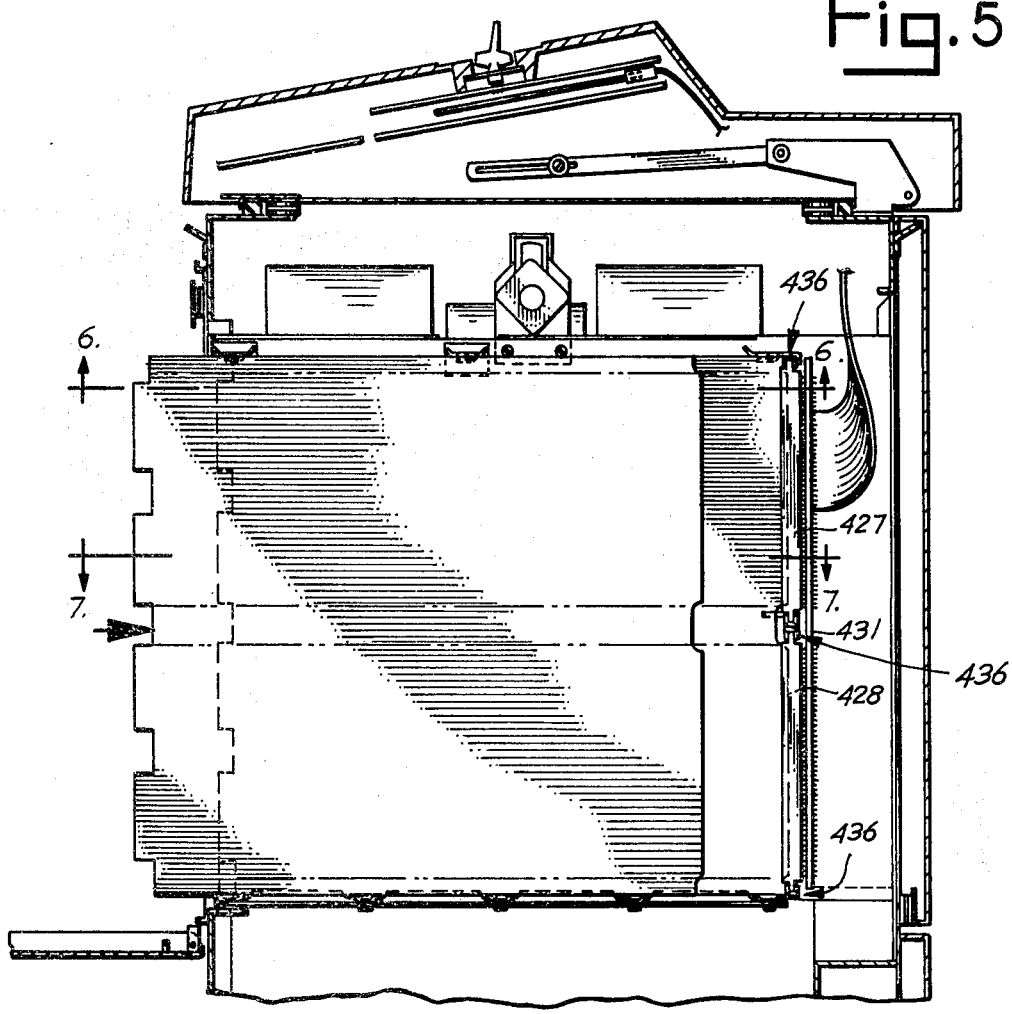
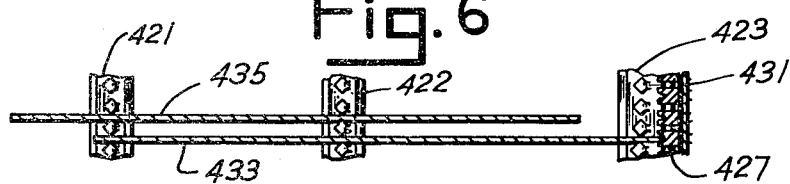
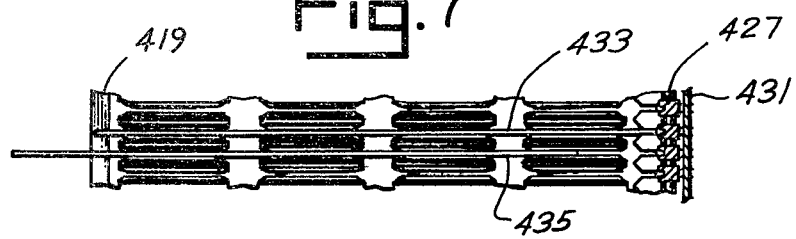

CIRCUIT BOARD MOUNTING AND COOLING ASSEMBLY

This is a division of application Ser. No. 894,925, filed Apr. 10, 1978.

BACKGROUND OF THE INVENTION

This invention relates to electronic data processing systems and more particularly to a central processing unit for use in such systems.

The central processing unit is advantageously instrumented with Large Scale Integration ("LSI") and Medium Scale Integration ("MSI") circuits. Such semiconductor "chips," or circuits, are selected from the Transistor-Transistor Logic ("TTL") family of devices.

TTL devices enjoy widespread use in electronic systems used in many different industries. As a result, many more types of functional subsystems have been embodied in TTL devices than in any of the other device families. Volume production of TTL devices amortizes their development cost and minimizes manufacturing process expenses. The result is that more functions in the processor can be implemented with LSI and MSI components, and these components are available at lower cost.

The widespread use of LSI and MSI devices in the processor results in improved system reliability and decreased design, debugging and servicing costs. Packing density increases and the number of interconnections external to the chips is reduced, thereby minimizing noise and other types of undesired effects.

Thus, the selection of TTL devices helps to create a highly compact, low-cost processor. The small size of the processor, itself an important advantage, contributes to the reduction of noise and other types of problems associated with the design of computers. As a result, special circuits which might otherwise be required to cope with such problems need not be added to the processor.

The central functions of a processor are sometimes carried out using so-called "Super High Speed" (Schottky) TTL circuits. By employing Schottky circuits, a substantial speed advantage over conventional TTL circuits is obtained.

This higher speed is obtained at a price: Schottky devices generate more heat than conventional high speed or standard TTL devices because they are not allowed to "saturate." The electronic hardware associated with one processor using super high speed TTL circuits is described in the copending parent and divisional applications identified in the previous section.

SUMMARY OF THE INVENTION

It is a principal object of the present invention to provide a central processing unit that is powerful but may be constructed at a low cost.

In accordance with one feature of the invention, heat generated by the highly concentrated electronic components is carried away by a forced flow of refrigerated air which is recirculated through and between the parallel, spaced-apart circuit boards. For ease of maintenance, the refrigeration unit, the power supply unit and the circuit boards take the form of independently removable modules. Novel circuit board support guides facilitate the removal testing and re-insertion of the boards.

These and other features to be described in more detail cooperatively interact to permit the construction of a highly compact, low cost processor.

DESCRIPTION OF THE DRAWINGS

These and other features and advantages of the present invention may be better understood through a consideration of the following detailed description. In the course of this description reference will frequently be made to the attached drawings, in which:

FIG. 5 is a cross-sectional side-elevation of card-cage and control-panel assembly (taken along the line 5—5 seen in FIG. 3;

FIGS. 6 and 7 are top and bottom views of the card-cage guides (taken along the lines 6—6 and 7—7 respectively as seen in FIG. 5);

DETAILED DESCRIPTION

As previously discussed, the logical elements making up the processor are often advantageously instrumented using TTL (Transistor-Transistor Logic) integrated circuits. The TTL chips are in turn mounted on printed circuit boards which interconnect the chips by means of four or more conductive layers. Selected ones of the layers form closely spaced, facing planes to which the ground and non-zero voltage (Vcc) potentials are applied. These facing planes provide a low-resistance, distributed capacitance source of operating potentials to each chip.

As noted earlier, the Schottky TTL devices which are employed in the preferred embodiment of the invention generate relatively large amounts of heat. The total heat generated is particularly significant if high component density employed.

In accordance with a further feature of the invention, this high heat density is controlled by recirculating refrigerated air maintained at a regulated temperature between the vertically aligned, spaced apart circuit boards.

Figure 1:
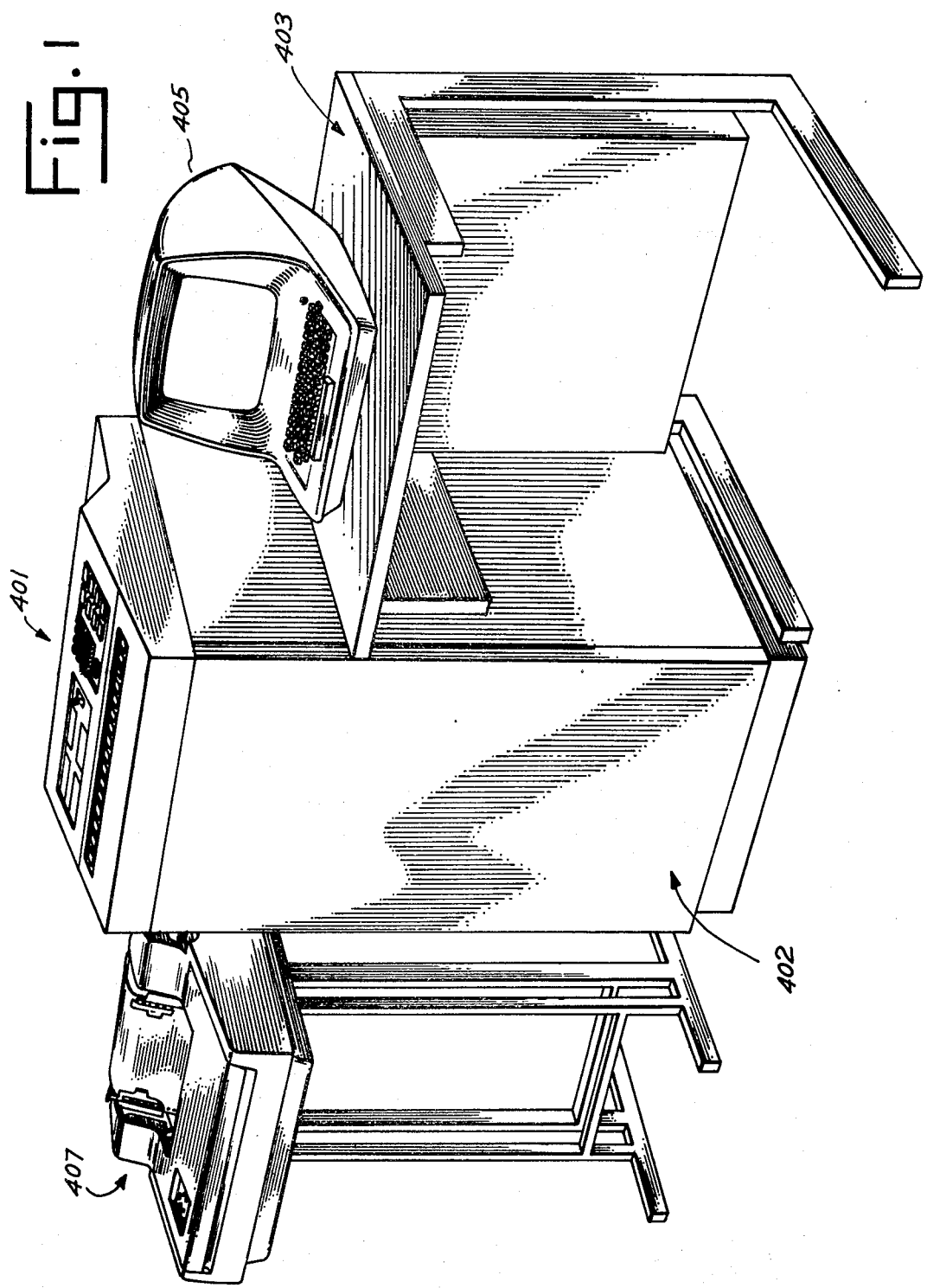
FIG. 1 is a perspective view showing the exterior appearance of a CPU cabinet which houses a central processing unit and other computer hardware, the CPU cabinet being shown with an adjoining operator's console desk and an operator message recording printer.

The circuit boards which make up the central processing unit, the input/output channels and a main memory of substantial capacity are advantageously housed together in a CPU cabinet whose exterior appearance is depicted in FIG. 1. A control panel, indicated generally at 401, is positioned at the top of the substantially rectangular cabinet 402. A console desk, indicated generally at 403, is attached to the side of the cabinet 402 and a combination key board input and CRT display terminal 405, which serves as the operator's system console, is positioned on the desk 403. A printer 407, which serves as the system recorder, is shown with the CPU unit in FIG. 1. (The system console 405 and the system recorder 407 are not part of the CPU, but are merely peripheral devices accessed through the input/output channels by operating system software).

Figure 2:
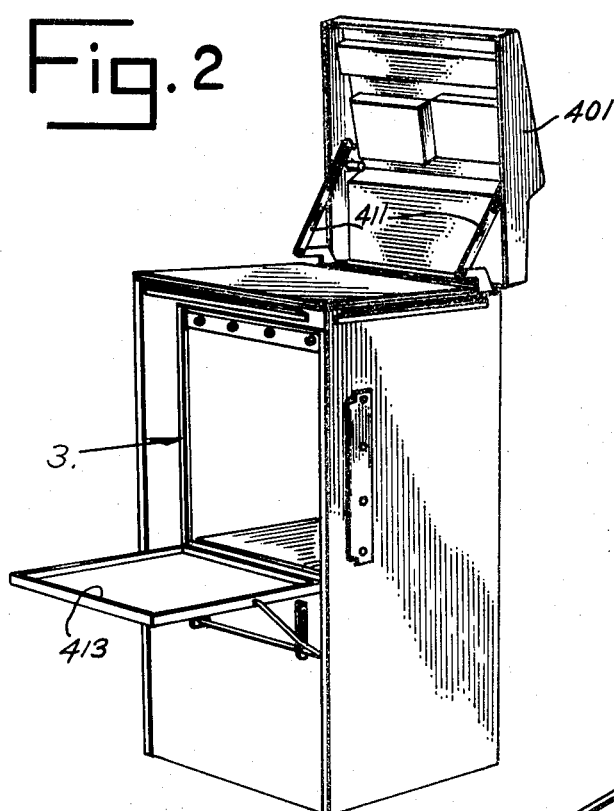
FIG. 2 is a perspective view of the CPU cabinet frame shown with the control panel raised and the card-cage access door lowered.
Figure 3:
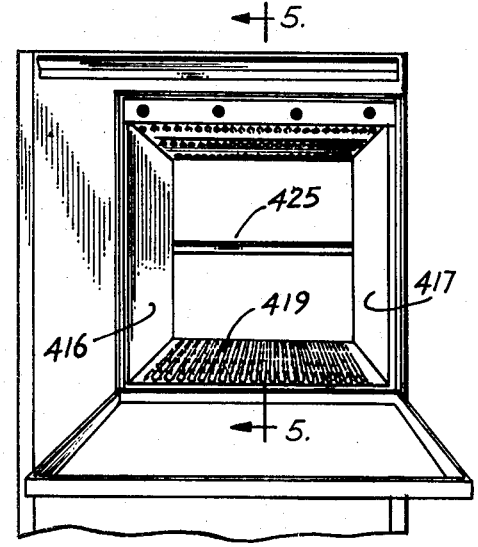
FIG. 3 is a front perspective view of the interior of the card-cage (from the vantage point 3 shown in FIG. 2)

The cabinet which houses the CPU electronics is designed to permit easy access to the components which make up the system. All four sides of the cabinet are provided with exterior panels which, as will be described, are readily removable. A perspective view of the CPU cabinet with the exterior side panels removed appears in FIG. 2. As there seen, the control panel 401 is hinge-mounted to the top of the interior cabinet frame, and is held in its fully raised position by a pair of braces 411. At the front of the cabinet a card cage door 413 is hinged at its lower edge and may be pivoted downwardly to form a horizontal work shelf and to provide access to the front of the card cage pictured in more detail in FIGS. 3 through 7.

Figure 4:
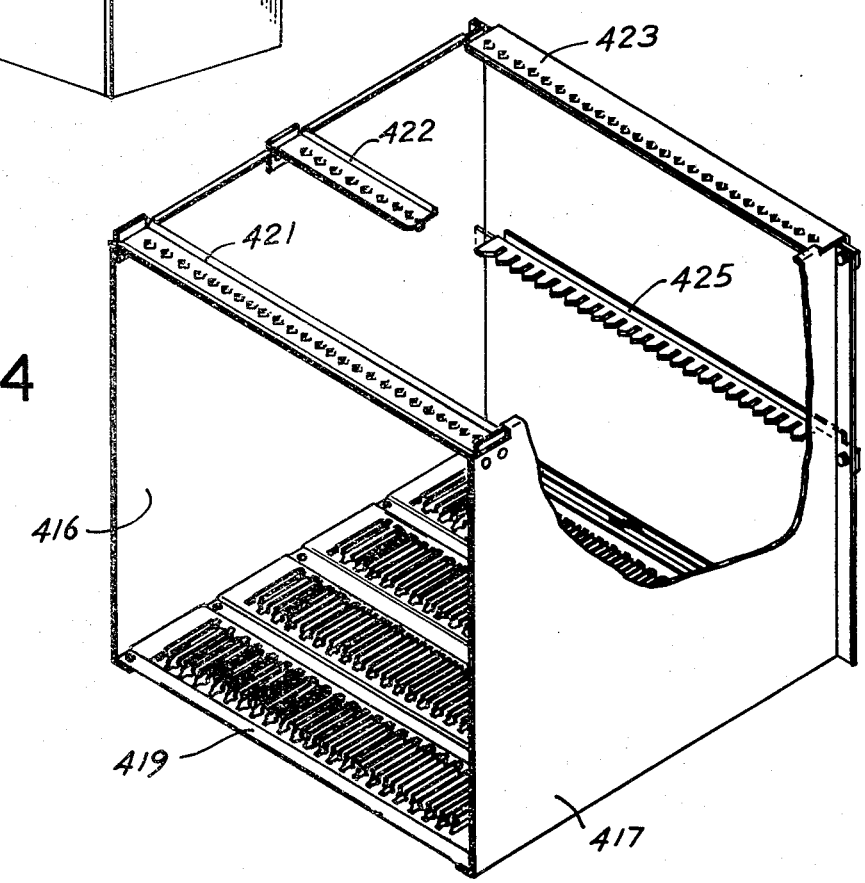
FIG. 4 is a perspective view of the card-cage with a portion thereof cut away to better depict interior details.

As clearly seen in the perspective view of FIG. 4 the card cage comprises a pair of side panels 416 and 417, a bottom grill panel 419, three horizontal guide bars 421, 422 and 423 which extend across the top of the card cage, and a rear central guide bar 425.

Figure 8:
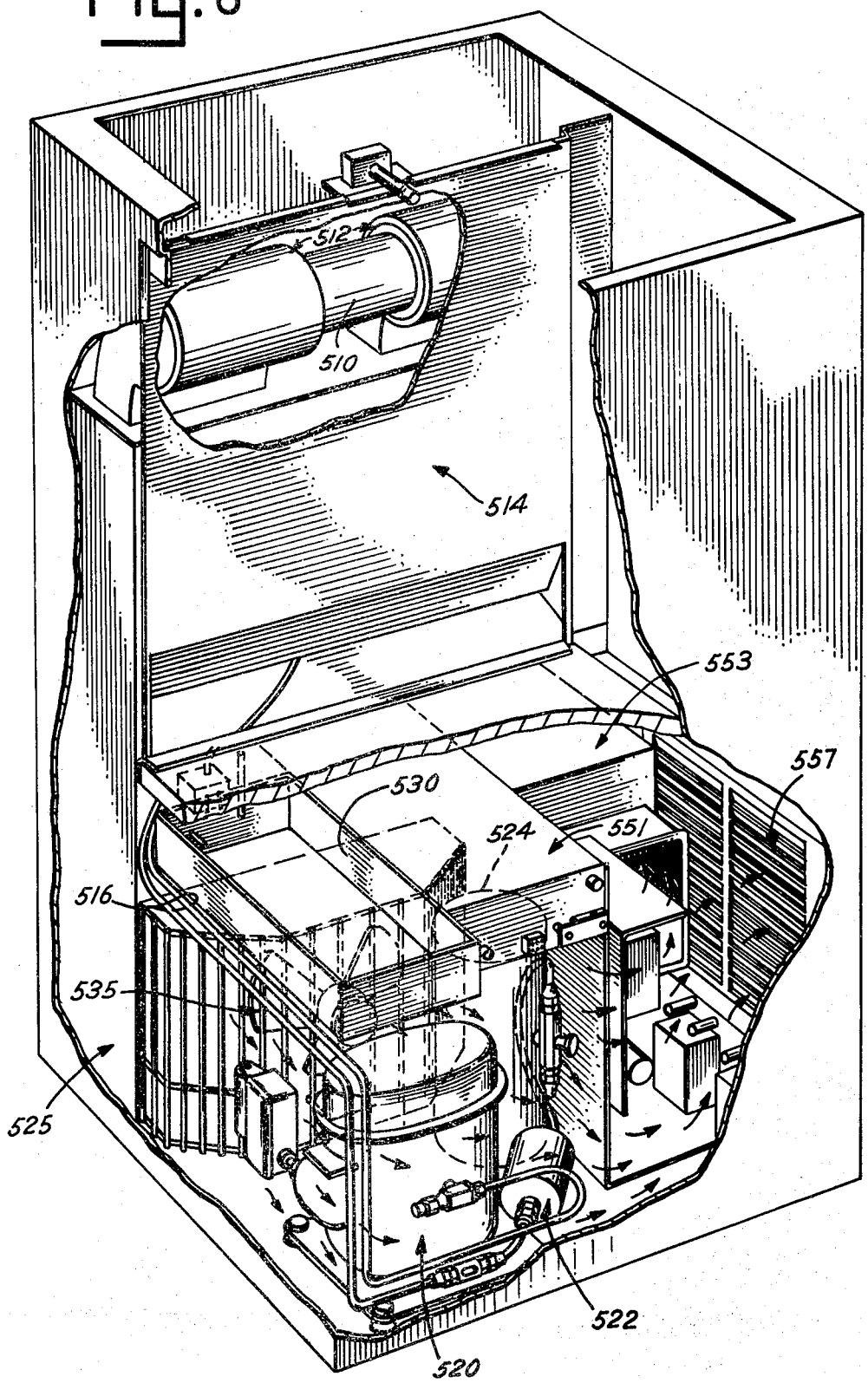
FIG. 8 is a perspective view of the lower portion of the CPU cabinet shown with the exterior frame cut away to illustrate the assembled refrigeration and power-supply modules.
Figure 9:
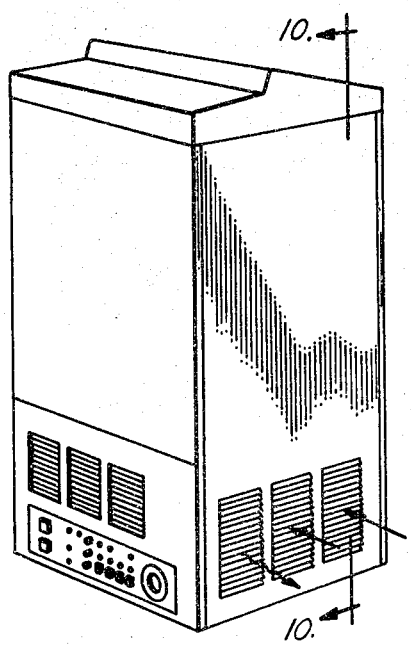
FIG. 9 is a perspective view of the rear quarter of the CPU cabinet illustrating the position of the cooling air intake and exhaust ports.

The grill plate 419 is shaped to form an array of regularly spaced guide channels separated by cooling apertures. As seen in FIGS. 5 through 7, circuit board cards are supported in spaced relation from one another by the grill 419, the guide bars 421-425 and by connectors 427, 428, which are rigidly affixed to the mother board 431 seen in FIG. 1. Two circuit boards are shown in FIGS. 6-8: the board 433 which is fully in place and plugged into the connector 427, and the board 435 which is shown only partly in place within the card cage.

The upper guide bars 421, 422 and 423 each presents a row of downwardly and forwardly directed pointed fingers whose function is best seen in FIG. 6. These fingers facilitate the insertion of the circuit board by guiding the board into centered engagement with the connectors 427 and 428. As the board is inserted into the card cage, its lower edge is guided by the support channel formed in the grill plate 419, while its upper edge is guided by the guide bars 421-423. Just prior to engagement with the connectors 423 and 427, the board is further aligned by the forwardly projecting fingers on the guide bar 425, most clearly seen in FIG. 19.

Guide bars 423 and 425 each provides channels indicated generally at 436 in FIG. 5 which receive and support flange members which extend from the top and bottom of the connectors 427 and 428. When all of the circuit boards have been disengaged from the connectors 427 and 428, those connectors together with the mother board 431 to which they are attached, may be readily removed by sliding the combined unit horizontally through the support channels 436.

Figure 10:
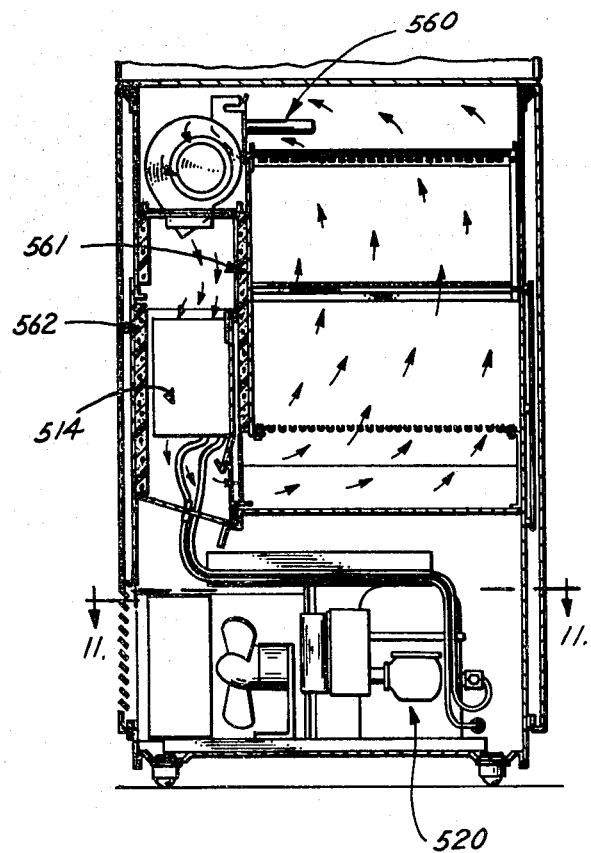
FIG. 10 is a cross-sectional side elevation of the CPU cabinet (taken along the line 10—10 seen in FIG. 9) to depict the recirculating flow path of the refrigerated air used to cool the electronic circuit boards mounted within the card cage.
Figure 11:
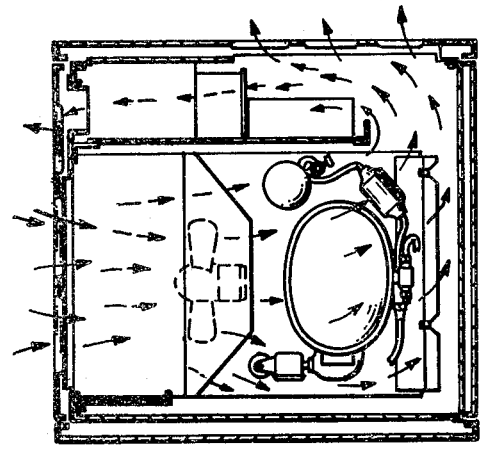
FIG. 11 is a cross-sectional view looking downwardly at the refrigeration and power supply models from the line 11—11 seen in FIG. 10 to illustrate the flow-path of the forced air employed to cool the refrigeration and power supply modules.
Figure 12:
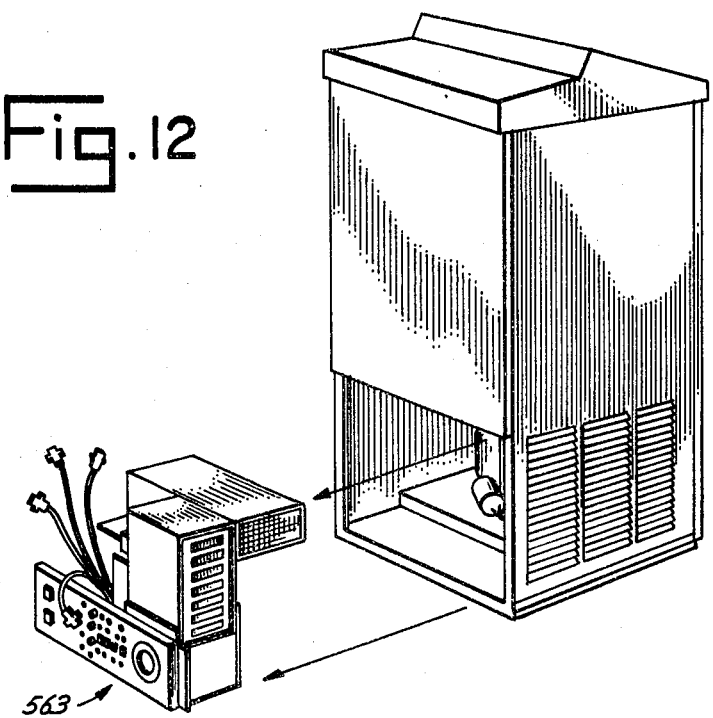
FIGS. 12 and 13 are perspective views of the CPU cabinet illustrating the independent removability of the power supply and refrigeration modules.
Figure 13:
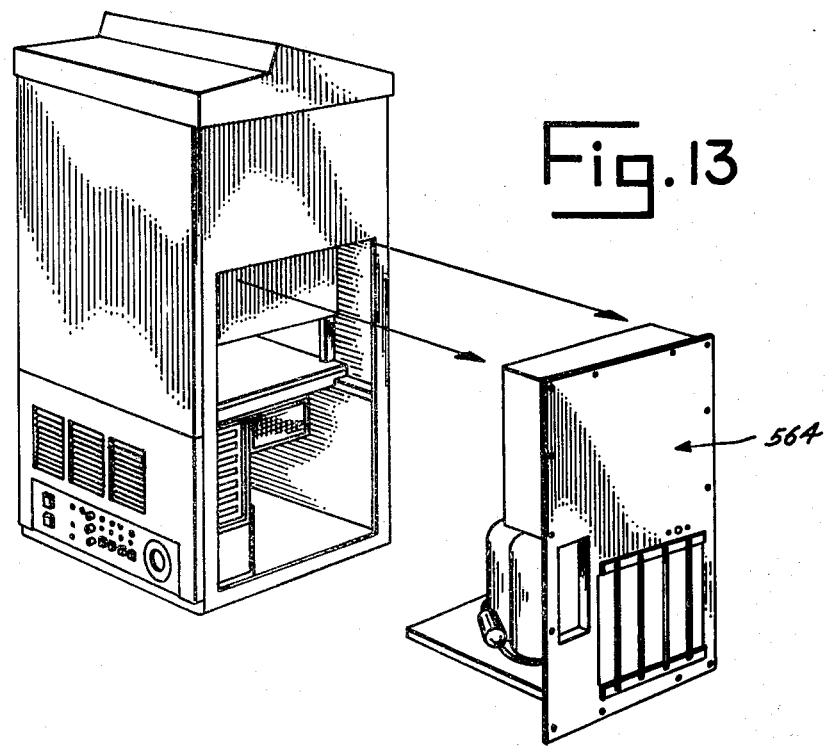

As noted previously, the closely packed components mounted on the circuit boards within the card cage generate substantial amounts of heat. In accordance with a feature of the present invention, this heat is removed by a forced flow of refrigerated air which circulates through the spaced apart circuit boards within the cage and through a cooling evaporator in a closed, recirculating air path. In addition, the evaporator forms part of a refrigeration module seen in the cut away view of FIG. 8. A motor 510 drives a pair of squirrel cage fans 512 which force air downwardly through an evaporator chamber indicated generally at 514. Tubes indicated at 516 carry refrigerant between the evaporator and a refrigeration compresser indicated generally at 520. Other portions of the refrigeration module include a filter drier 522, an accumulator 524, a radiator condenser chamber 525, a pan 530 for holding condensate from the evaporator 514 and a fan 535 which draws air through intake louvers seen at 540 in FIGS. 9 through 12. The cooling air driven by fan 535 then flows over the other components of the refrigeration unit as depicted in FIGS. 8 and 10 and over and through the components of the power supply module which includes a 12 volt power supply chassis, indicated generally at 551, and a 5 volt power supply chassis, indicated generally at 533. Cooling air driven by the fan 535 is expelled through the rear louvers 557 and through the side panel louvers 560. As seen in FIGS. 12 and 13, the power supply and refrigeration modules are independently removable from the CPU cabinet to facilitate repair and replacement.

FIG. 13 of the drawings shows the air flow path within the refrigerated circuit board card cage. The temperature of the air flowing upwardly out of the card cage is monitored by a sensor seen at 560 in FIG. 10. The sensor 560 activates the compressor 520 whenever the temperature of air from the card cage exceeds a predetermined value (e.g. 25° C.). The evaporator chamber 514 is insulated from the remainder of the system by the insulating wall panels seen at 561 and 562 in FIG. 10. The card cage itself need not be thermally insulated since it is maintained at approximately room temperature.

FIGS. 12 and 13 illustrate the manner in which the power supply module (indicated generally at 563 in FIG. 12) and the refrigeration module (indicated generally at 564 in FIG. 13) may be independently removed for repair or replacement.

Figure 14:
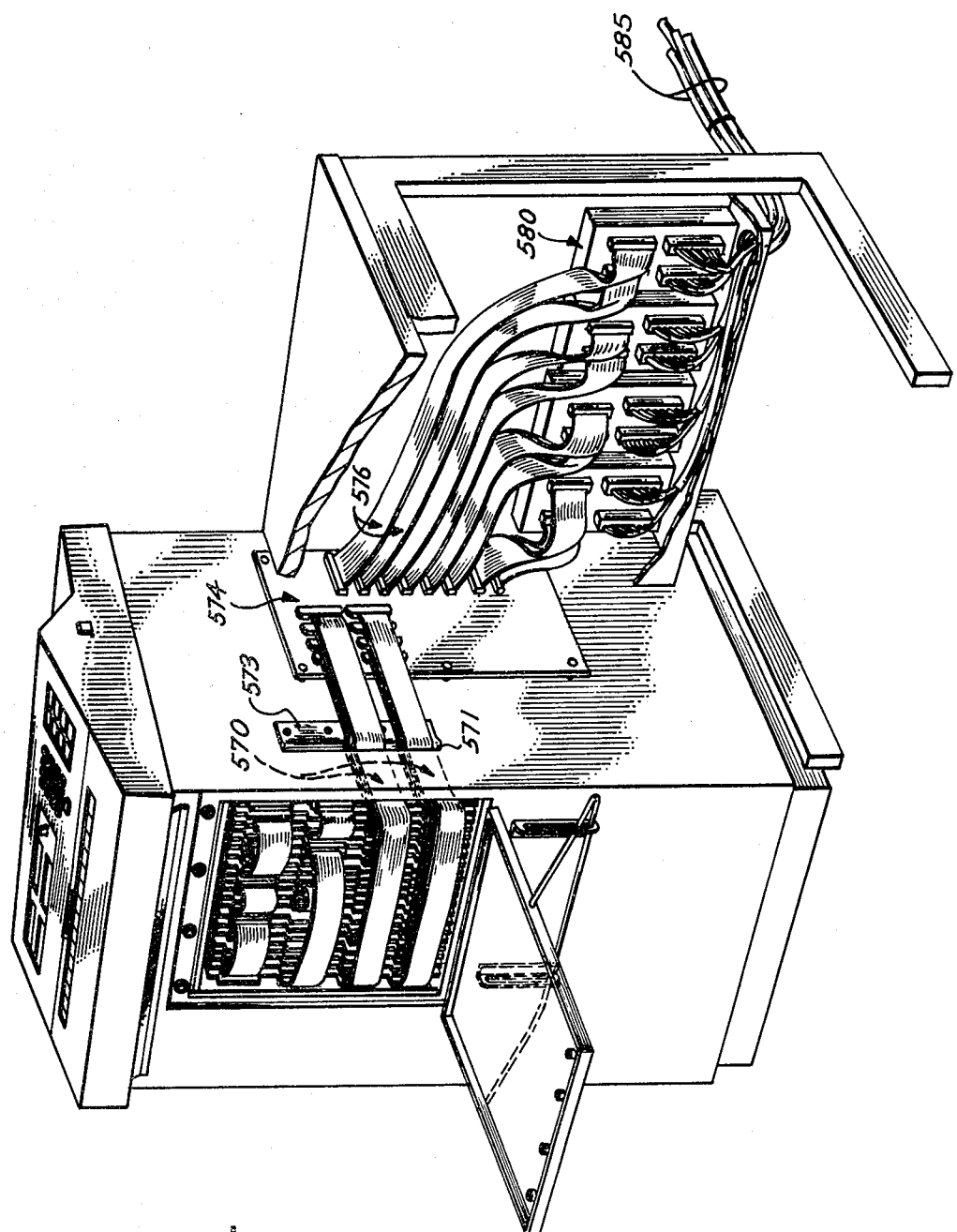
FIG. 14 is a perspective view of the CPU cabinet and console desk with portions thereof cut away to show the routing of input-output bus ribbon cables from the card cage to the junction box housing mounted on the inner rear wall of the console desk.

FIG. 14 of the drawing shows the CPU cabinet with circuit boards and input/output cables in place. These cables comprise ribbon conductors 570 which span laterally across the forward face of the card cage and through an aperture 571 where they are secured by a pressure plate 573. The ends of ribbon conductors are equipped with connectors which plug into a cross-connect panel 574. A second set of ribbon connectors 576 connect the panel 472 to a plurality of junction boxes indicated generally at 580 in FIG. 14. The junction boxes 580 are mounted on the rear wall of the console desk 403. Junction boxes 580 interconnect the ribbon connectors 576 to conventional input/output wiring harness connectors at the ends of the cables 585 which connect the system to peripheral devices and controllers. The entire ribbon cable assembly is concealed behind removable panels during normal system use as depicted in FIG. 1.

CONCLUSION

It is to be understood that the specific embodiment of the invention which has been described is merely illustrative of one application of the principles of the invention. Numerous modifications may be made to the preferred embodiment which has been disclosed without departing from the true spirit and scope of the invention.

What is claimed is:

1. A card assembly for housing a plurality of removable electronic circuit boards comprising, in combination:
   a pair of substantially planar, parallel, vertically oriented, spaced-apart side-panels;
   a bottom grill plate extending between the bottom edges of said side panels, said grill plate being shaped to form an array of regularly spaced guide channels separated by cooling apertures;
   connector support means extending between the rear edges of said side-panels for mounting a plurality of vertically oriented circuit board connectors, each of said connectors being adapted to engage with one of said cards; and
   a plurality of spaced, horizontal guide support members extending between the upper edges of said side-panels, each of said support members defining a plurality of horizontally spaced, forwardly-directed, pointed guide fingers, adjacent pairs of said guide fingers being positioned to horizontally align one of said circuit boards for centering the engagement with one of said connectors.

2. A card cage assembly as set forth in claim 1 wherein said vertically oriented connectors include support flange members which extend from the top and bottom thereof, and wherein said connector support means include horizontally extending support channels shaped to receive and support said support flanges on said connectors.

3. A cabinet for housing a plurality of electronic circuit boards comprising, in combination:
   an external wall;
   a card cage assembly, fixed within said external wall, composed of a pair of side walls, a mother-board extending between the rear edges of said side walls for supporting a plurality of circuit board connectors, a movable access panel extending between the forward edges of said side walls, and a bottom grill plate extending between the bottom edges of said side walls, said grill plate being shaped to form an array of card support channels separated by cooling apertures; and
   a refrigeration unit comprising an evaporator and a fan adapted to removably mate with said card cage assembly to form a closed recirculating air path, said evaporator being positioned adjacent one of said side walls and thermally insulated therefrom and from said exterior wall of said cabinet, and said fan being adapted to circulate air downwardly through said evaporator and upwardly through said card cage assembly.

4. A cabinet as set forth in claim 3 wherein said refrigeration unit further includes a compressor and a temperature sensor, said sensor being mounted in said closed recirculating air path for activating said compressor whenever the temperature in said air path exceeds a predetermined level.

5. A cabinet as set forth in claim 4 wherein said sensor is mounted substantially above said evaporator.

6. A cabinet as set forth in claim 5 wherein said sensor is mounted substantially above said card cage assembly.

* * * * *